United States Patent
Rowe et al.

(10) Patent No.: US 8,535,554 B2
(45) Date of Patent: Sep. 17, 2013

(54) HIGH-PH SYNTHESIS OF NANOCOMPOSITE THERMOELECTRIC MATERIAL

(75) Inventors: Michael Paul Rowe, Pinckney, MI (US);
Minjuan Zhang, Ann Arbor, MI (US);
Paul Jantzen, Pearland, TX (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 385 days.

(21) Appl. No.: 12/843,954

(22) Filed: Jul. 27, 2010

(65) Prior Publication Data

US 2012/0025130 A1  Feb. 2, 2012

(51) Int. Cl.
*H01L 29/12* (2006.01)

(52) U.S. Cl.
USPC ....... 252/62.3 T; 427/215; 428/403; 136/238; 136/240; 977/823; 977/775; 977/776; 977/890

(58) Field of Classification Search
USPC ............... 252/62.3 T; 427/215; 428/403; 136/238, 240; 977/823, 775, 776, 890
See application file for complete search history.

(56) References Cited

U.S. PATENT DOCUMENTS

| | | | |
|---|---|---|---|
| 7,255,846 B2 | 8/2007 | Ren et al. | |
| 7,259,320 B2 | 8/2007 | Take | |
| 7,465,871 B2 | 12/2008 | Chen et al. | |
| 2008/0087314 A1 * | 4/2008 | Xiao et al. | 136/201 |
| 2008/0280753 A1 | 11/2008 | Watanabe et al. | |
| 2010/0215852 A1 * | 8/2010 | Rowe et al. | 427/213.3 |
| 2012/0018681 A1 * | 1/2012 | Rowe | 252/506 |

FOREIGN PATENT DOCUMENTS

| | | | |
|---|---|---|---|
| JP | 2010-10366 | * | 1/2010 |
| JP | 2010-93024 | * | 4/2010 |

OTHER PUBLICATIONS

Translation for JP 2010-10366, Jan. 14, 2010.*

* cited by examiner

*Primary Examiner* — Carol M Koslow
(74) *Attorney, Agent, or Firm* — Gifford, Krass, Sprinkle, Anderson & Citkowski, P.C.

(57) ABSTRACT

A process for forming thermoelectric nanoparticles includes the steps of providing a core material and a bismuth containing compound in a reverse micelle; providing a tellurium containing compound either in or not in a reverse micelle; reacting the bismuth containing compound with the tellurium containing compound in the presence of a base, forming a composite thermoelectric nanoparticle having a core and shell structure.

31 Claims, 10 Drawing Sheets

HIGH-PH SYNTHESIS OF NANOCOMPOSITE THERMOELECTRIC MATERIAL

FIELD OF THE INVENTION

The invention relates to thermoelectric nanoparticles and in particular to a process for producing thermoelectric composite nanoparticles and thermoelectric nanocomposite materials.

BACKGROUND OF THE INVENTION

Thermoelectric materials and devices may be utilized to obtain electrical energy from a thermal gradient. Current thermoelectric materials have a limited thermoelectric conversion efficiency which may be defined in terms of the formula $ZT=TS^2\gamma/\kappa$. The ZT of the above formula or figure of merit is related on the macroscopic transport parameters of the material including the Seebeck coefficient S, the electrical conductivity $\gamma$ and the thermal conductivity $\kappa$.

In order to improve the thermoelectric conversion efficiency one may increase the Seebeck coefficient and electrical conductivity while lowering the thermal conductivity. Increasing the ZT is difficult as the three parameters S, $\gamma$ and $\kappa$ are interrelated. For example, doping of a specific material may increase the electrical conductivity while decreasing the Seebeck coefficient and increasing the thermal conductivity. There is therefore a need in the art for a material having a ZT improved over current prior art materials. There is also a need in the art for increasing the thermoelectric conversion by increasing or maintaining the Seebeck coefficient and electrical conductivity while lowering a thermal conductivity.

Nanostructured materials may be utilized to produce thermoelectric nanoparticles and materials that may be utilized to form a thermoelectric composite material. However, such nanostructured materials may be difficult and expensive to manufacture and may be difficult to process to form a composite material. There is therefore a need in the art for a thermoelectric nanostructured material and a process for producing the same that produces materials having an increased thermoelectric conversion efficiency. Additionally, there is a need in the art for a process for producing the thermoelectric nanoparticles that is cost efficient and scalable. Further, there is a need in the art for a process for producing thermoelectric composites having improved properties that overcomes technical problems of manufacturing in the prior art.

SUMMARY OF THE INVENTION

In one aspect, there is disclosed a process for forming thermoelectric nanoparticles that includes the steps of providing a core material and a bismuth containing compound solution that is basic, providing a tellurium containing compound, and reacting the bismuth containing compound with the tellurium containing compound in a basic solution, forming thermoelectric nanoparticles.

In a further aspect, there is disclosed a process for forming thermoelectric materials that includes the steps of forming a core material reverse micelle or micelle, adding a basic bismuth containing compound to the core material reverse micelle or micelle forming a reverse micelle or micelle having the bismuth containing compound dispersed therein, and adding the tellurium containing compound with the formed micelle or reverse micelle in the presence of a reducing agent that alloys with the bismuth containing compound forming composite thermoelectric particles having a core and shell structure.

DETAILED DESCRIPTION OF THE PREFERRED EMBODIMENTS

Figure 1:
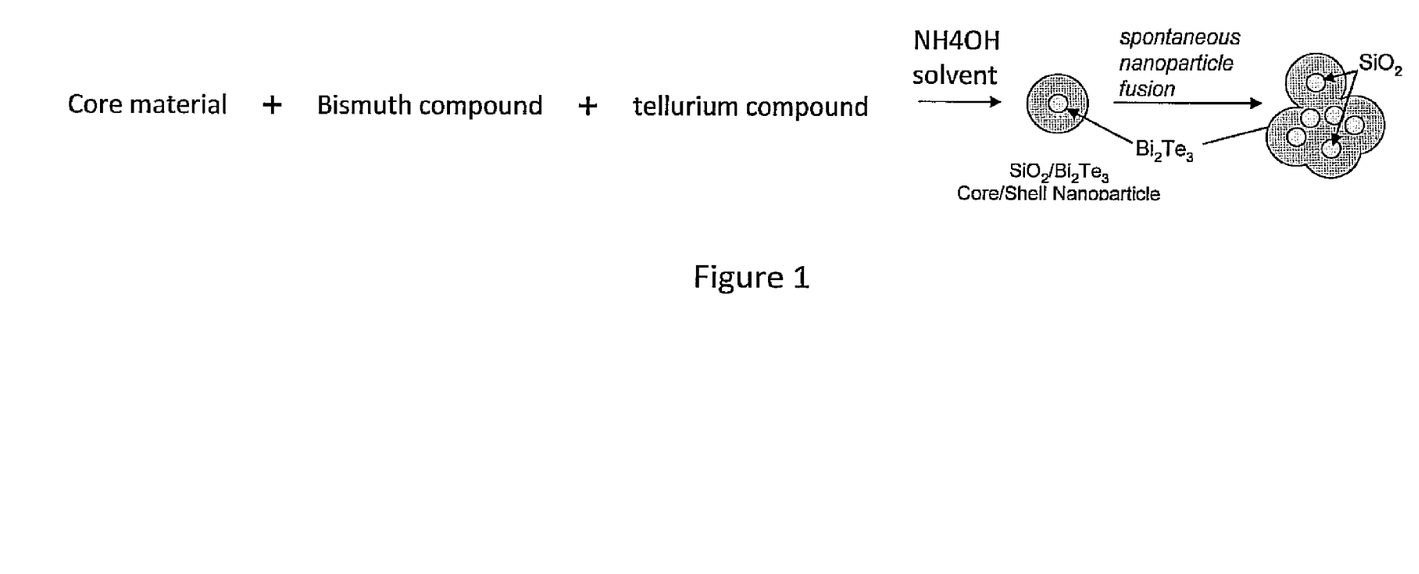
FIG. 1 is a graphical depiction of the steps of one embodiment of the invention.

Referring to FIG. 1, there is shown a first embodiment of a process for forming thermoelectric nanoparticles that includes the steps of providing a core material and a bismuth containing compound in a basic solution, providing a tellurium containing compound, and reacting the bismuth containing compound with the tellurium containing compound in the presence of a base forming thermoelectric nanoparticles. In one aspect, the bismuth containing solution has a pH greater than 7.

In one aspect, the bismuth containing compound may be selected from bismuth citrate, ammonium bismuth citrate and other bismuth salts soluble in a basic solution. As stated above, the bismuth containing compound is preferably soluble in a pH of the basic range.

In one aspect, the tellurium containing compound may be selected from tellurium salts and sodium tellurium hydride. Additionally, tellurium powder may be utilized directly to synthesize a tellurium reducing-agent in situ.

The bismuth containing compound such as bismuth citrate will react with the tellurium containing compound such as sodium tellurium hydride to spontaneously alloy about a core material particle. In one aspect, the core material may be selected from various materials including: $SiO_2$, metals, semiconductors, insulators, ceramics, carbon, polymers, salts or combinations thereof and ceramic materials including alumina, titanium dioxide, and zirconium oxide and a shell selected from $Bi_2Te_3$, chalcogenide semiconductors including bismuth telluride and lead telluride, metals, semi-metals including binary, ternary and quaternary alloys of conductors, semiconductors, and insulators, compounds of silicon and germanium, skutterudite materials including $CoSb_3$ materials, rare earth intermetallics including $YbAl_3$, clathrate structured materials including silicon germanium or SN framework based materials, $Mg_2Si$ and doped forms of $Mg_2Si$, half heusler alloys including MNiSn materials where M may represent Zr, Hf and Ti, multicomponent metal oxides including $NaCo_2O_4$, $Ca_3Co_4O_9$, and thermoelectric materials and doping materials including groups III, IV, V, VI, and VII elements, oxides of such elements, alloys, and salts.

The process may also include the steps of providing various dopants that are desirable in a thermoelectric material. The process may include the steps of providing P-type and N-type dopants to the final thermoelectric compound. In one aspect, the process may include the step of providing a P-type dopant with the bismuth containing compound. Various P-type dopants may be included such as antimony, antimony salt, and potassium antimony tartrate. Additionally, the process may include the step of providing an N-type dopant with the tellurium containing compound. In one aspect, the N-type dopants may be selected from various compounds including selenium and sodium selenium hydride.

Figure 2:
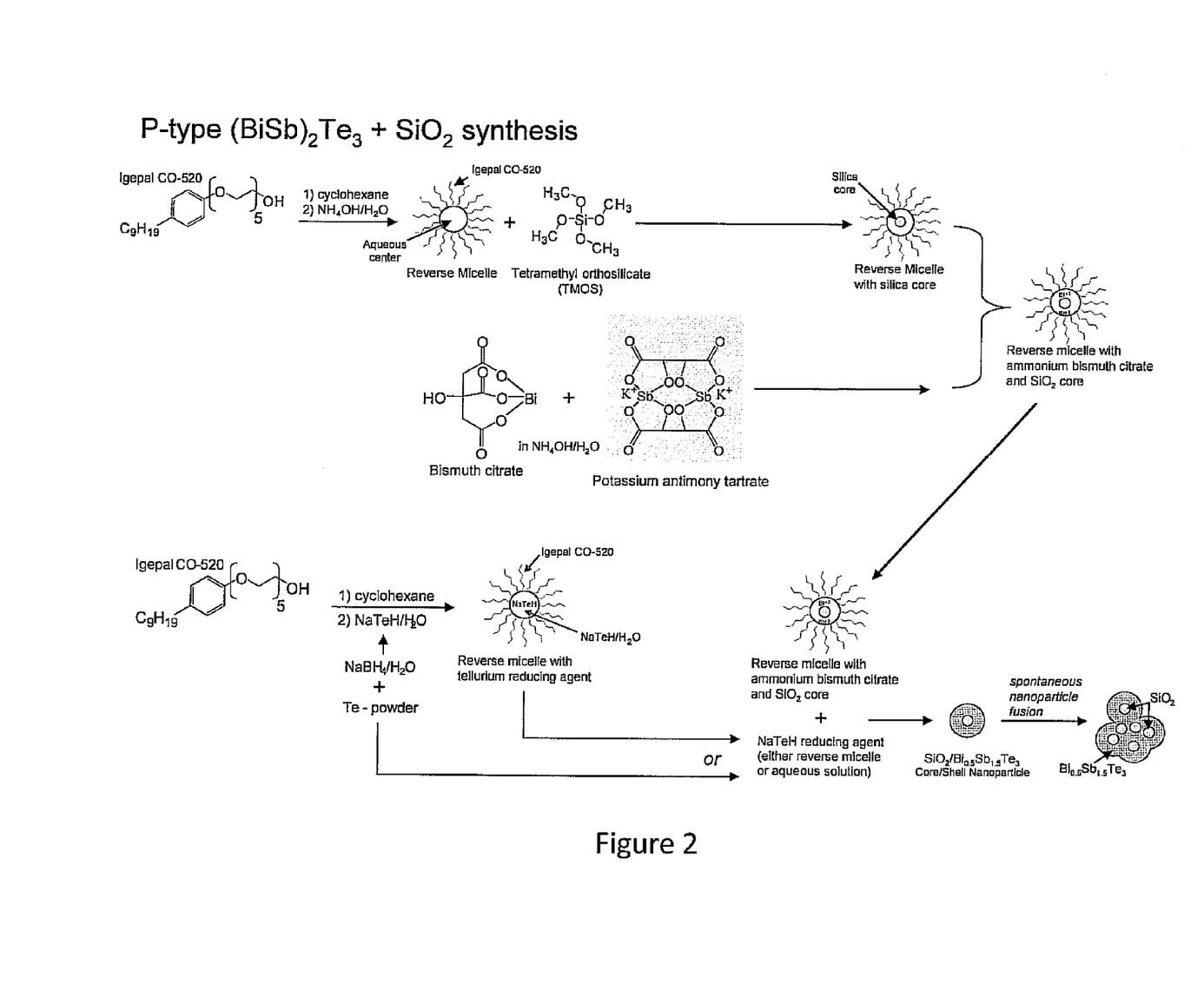
FIG. 2 is a graphical depiction of the steps of another embodiment.
Figure 3:
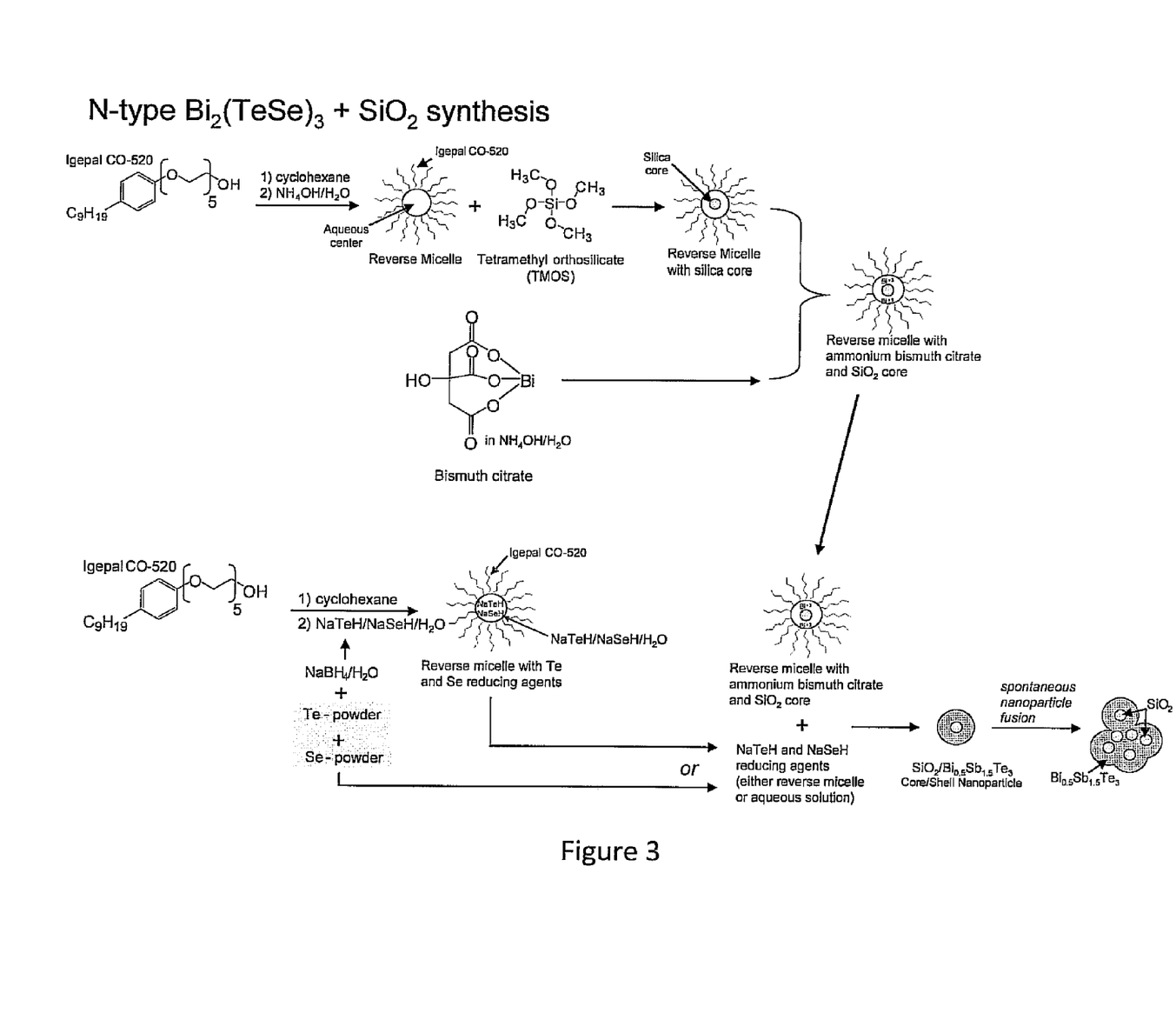
FIG. 3 is a graphical depiction of the steps of a further embodiment.

In one aspect, the process as disclosed in FIGS. 2 and 3 may include the use of micelles and/or reverse micelles. In one aspect, the process may include the steps of forming a core material reverse micelle or micelle, adding the bismuth containing compound to the core material reverse micelle or micelle forming a reverse micelle or micelle having the bismuth containing compound dispersed therein, adding the tellurium containing compound with the formed micelle or reverse micelle in the presence of a reducing agent that alloys with the bismuth containing compound forming composite thermoelectric nanoparticles having a core and shell structure. As with the process described above, P-type and N-type dopants may be included with the bismuth containing compound and the tellurium containing compound respectively. Additionally, the tellurium containing compound may be introduced by the formation of a reverse micelle or micelle having the tellurium containing compound dispersed therein. The N-type dopant as described above may be added with the tellurium containing compound for dispersion within a reverse micelle or micelle or may be added separately.

The process may also include the step of dividing the reverse micelles or micelles having the bismuth containing compound with the reverse micelles or micelles having the tellurium compound dispersed therein.

The step of forming a core material micelle or reverse micelle may include the steps of dissolving a surfactant in an organic solvent or aqueous solution and then adding an aqueous phase or an organic phase to the dissolved surfactant and then adding a core material. These steps form a core material nanoparticle dispersed in an aqueous portion of the reverse micelle. Additionally, additional steps selected from the following group may also be performed. The group may include: adjusting the pH to initiate a core formation reaction; introducing a reagent to initiate a core formation reaction; irradiating or heating to initiate a core formation reaction; and adjusting the pH to stabilize the system.

In another aspect, the step of forming a micelle or reverse micelle having the bismuth containing compound dispersed therein may include the steps of dissolving a surfactant in a solvent or aqueous solution, adding the bismuth containing material to the dissolved surfactant forming a reverse micelle or micelle having a solvent or an aqueous portion including the bismuth containing material. Additionally, further materials may be dissolved in the surfactant such as the dopants described above such that the dopant and bismuth containing material are dissolved in the surfactant forming a micelle or reverse micelle having an aqueous portion including the additional material.

Alternatively, the step of forming a core material micelle or reverse micelle may include the steps of dissolving a surfactant in a solvent, adding ammonium hydroxide to the solvent and adding tetramethyl orthosilicate to the material forming silicon dioxide nanoparticles dispersed within an aqueous portion of the micelle or reverse micelle. Following the formation of the micelle or reverse micelle, the bismuth containing compound may be introduced into the micelle or reverse micelle.

Alternatively, the core material may already be formed as a nanoparticle and added either directly, in a solution, or within a micelle or reverse micelle.

As stated above, bismuth citrate may be utilized as the bismuth containing compound and dissolves with a surfactant to form the micelle or reverse micelle. Additionally, the tellurium micelle or reverse micelle may be formed by utilizing sodium tellurium hydride that is dissolved in the surfactant to form the micelle, described above. When the bismuth citrate micelle is combined with the tellurium micelle, bismuth ions of the bismuth citrate are reduced to bismuth metal in the presence of tellurium wherein a spontaneous alloying step occurs about the core nanoparticles. In one aspect, the core nanoparticles may have a size of from 1 to 50 nanometers in diameter. In another aspect, the composite thermoelectric nanoparticles may have a shell thickness of from 0.5 to 100 nanometers.

Following the formation of the thermoelectric nanoparticle composites, various isolation and purification steps may be performed. For example, the process may include the steps of decanting the composite thermoelectric nanoparticles following their formation as well as the step of washing the composite thermoelectric nanoparticles to minimize the amount of contaminants that may be included in the thermoelectric nanoparticles. In one aspect, the washing step may include washing the composite thermoelectric nanoparticles with an organic solvent and water. The washing step may be performed multiple times with water and the organic solvent separately. The washing steps may also include rinsing with other solutions such as using various acids or bases to limit the amount of contaminants in the composite thermoelectric nanoparticles.

Following the formation of the thermoelectric nanoparticles, the material may be formed into a nanocomposite material for use in thermoelectric devices. In one aspect, the nanoparticles may spontaneously fuse forming a nanocomposite material following the formation of the thermoelectric nanoparticles such that the nanocomposite material includes a network. In another aspect, the forming step may include sintering the composite thermoelectric materials forming a network of the shell material including inclusions of the core material nanoparticles.

EXAMPLES

The following examples are detailed for various aspects of the process wherein bismuth telluride shell materials are formed about a silicon dioxide core to form composite nanoparticles.

Examples

Either nitrogen or argon gas is used throughout the synthesis to evacuate the reaction of oxygen. To a 250 mL Schlenk flask is added 5,909 g of Te powder, 103 mL of $H_2O$, and a Teflon stir bar. Good results may be achieved using −200 mesh Te powder. Larger mesh powders may also be utilized. To make N-type $Bi_2(TeSe)_3$, Se powder is added at this stage to the flask.

The reaction flask may then be cooled in an ice water bath for 10 mins. 6.235 g of $NaBH_4$ is added in portions under a backflow of inert gas to the reaction stirring briskly. Each portion of $NaBH_4$ is allowed a moment to dissolve before adding additional reducing agent. This is intended to avoid any possible buildup of heat in the reaction flask.

The reaction is allowed to stir under inert gas until all the Te has dissolved. This generally takes from 6 to 8 hours. The water bath is kept in place as a heat sink throughout the NaTeH formation. The time needed for the reaction to go to completion depends on factors such as surface area of the Te powder, rate and effectiveness of stirring, and how quickly the reaction warms up to room temperature. The reaction will go through a series of color changes; ending in a purple liquid with white precipitate. It is common to allow the NaTeH synthesis to run for more than 8 hours, and then use it the next day to successfully make composite nanoparticles.

A 1 L 4-neck round bottom flask is fitted with a Teflon-coated stirring paddle and the appropriate adaptor needed to make an oxygen-free environment in the reaction flask. A stirring paddle is recommended for this reaction scale because very aggressive stirring of the emulsion was found to help the distribution of constituent elements throughout the nanocomposite. The flask is degassed with inert gas.

An emulsion is created next. 23.286 g of Igepal CO-520 and 265 mL of cyclohexane are added to the 1 L round bottom reaction flask. Aggressive stirring with the stirring paddle is begun and maintained throughout the entire synthesis. A solution of 5.36 mL $H_2O$ and 38.8 µL 30% ammonium hydroxide is made and then added to the reaction flask. This emulsion is then stirred for 5 mins. 3.35 mL of tetramethyl orthosilicate is added to the emulsion to grow silica nanoparticles in situ.

The reaction is then stirred under an inert atmosphere for at least 4 hours. Reactions have been kept stirring at this stage of the synthesis for up to 15 hours.

After at least 4 hours of stirring the $SiO_2$ nanoparticle synthesis, 3.48 mL 30% ammonium hydroxide is dissolved in 6.02 mL of $H_2O$. Into this ammonium hydroxide solution is dissolved 7.743 g of potassium antimony tartrate trihydrate and 3.088 g bismuth citrate. To make undoped $Bi_2Te_3$ or N-type $Bi_2(TeSe)_3$, the antimony salt is omitted. This solution can require substantial mixing and sonication to fully dissolve all of the antimony and bismuth salts. The antimony and bismuth salts may be added in portions to the ammonium hydroxide solution.

The bismuth solution is then added to the reaction flask containing the $SiO_2$ nanoparticle synthesis. Aggressive stirring is continued under an inert atmosphere.

After the antimony and bismuth solution has been stirred aggressively with the $SiO_2$ nanoparticle synthesis for 10 mins, the reaction is ready for the NaTeH to be added. The NaTeH must first be filtered through a flitted glass filter, again being careful not to expose it to the air. The resulting purple liquid is added quickly dropwise to the 1 L reaction flask containing the bismuth and silica, and antimony when P-type material is being produced. The reaction flask should be stirring as quickly and aggressively as possible to avoid localized concentrations in the synthesis. The filter cake isolated when the NaTeH reaction was filtered is then washed with 25 mL of $H_2O$. This water wash is also filtered through the same fitted glass filter and added to the synthesis quickly dropwise. After all of the NaTeH solution is added to the synthesis, the reaction is stirred for an additional hour under an inert atmosphere.

The emulsion is then broken to help make purification easier. 100 mL of methanol or acetone is stirred into the reaction to precipitate the composite nanoparticles out of the suspension formed by the Igepal CO-520. The composite nanoparticles can then be isolated from the crude product solution by either allowing them to settle on their own or by centrifugation. With either method, the product should not be exposed to air in order to avoid oxide formation. The composite nanoparticles are finally recovered by decanting off the reaction solution.

The composite nanoparticles are then transferred to a filtering thimble, either fritted-glass or cellulose, and placed in a Soxhlet extraction setup that has been degassed with inert gas. During such transfers, the nanoparticles are kept as a methanol slurry to limit oxidation. The Soxhlet is charged with methanol and the composite nanoparticles are washed, always under an inert environment, for 1 to 4 hours. The washing time varies according to the rate of refluxing in the Soxhlet, how compacted the composite nanoparticle sample is, and the coarseness of the filter thimble. Generally, the composite nanoparticles are washed until obvious amounts of materials are no longer being extracted out of the thimble.

The methanol is now substituted for a mixture of 260 mL $H_2O$ and 150 mL 30% ammonium hydroxide. The ammonium hydroxide washing generally takes 4 to 14 hours. Again, variations in the time occur based on the rate of refluxing, how compacted the composite nanoparticle sample is, and the coarseness of the filter in the filtering thimble.

The wash solvent in the Soxhlet extractor is now switched back to methanol. This is a final rinse and is only conducted for 2 to 4 hours of refluxing time.

Still being careful to avoid air contacting the composite nanoparticles, the now purified product is transferred, with additional methanol, to a flask for drying. An inert gas stream is blown through the flask over the slurry of purified material to slowly dry it while it is being sonicated. This procedure should take several hours.

The now dried composite nanoparticles are a black, brittle material that is easily broken up into an extremely fine powder.

Samples of this purified powder may be initially baked at 395° C. for 5 mins under an argon flow. Punch and dies (for sintering the composite nanoparticles) are then loaded in the glove box. The thermoelectric composite nanoparticles may be sintered in a hot press at 395° C. and 50 MPa for 1 hour.

The process described in the examples produces composite nanoparticles having a size of less than 10 nanometers and may include antimony or selenium-doped bismuth telluride with silica inclusions. Bismuth telluride nanoparticles produced by the process are shown in the TEM image of FIG. 4. The XRD spectra of the bismuth telluride are shown in FIG. 5. The XRD data indicates formation of a pure bismuth telluride material.

Figure 4:
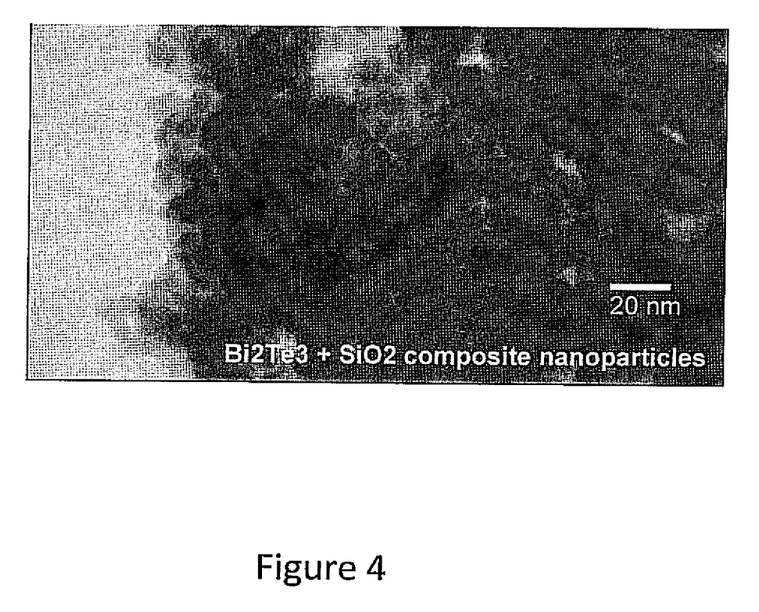
FIG. 4 is an TEM image of a thermoelectric material produced by one embodiment and including a bismuth telluride network having silicon dioxide nanoparticles dispersed therein.
Figure 5:
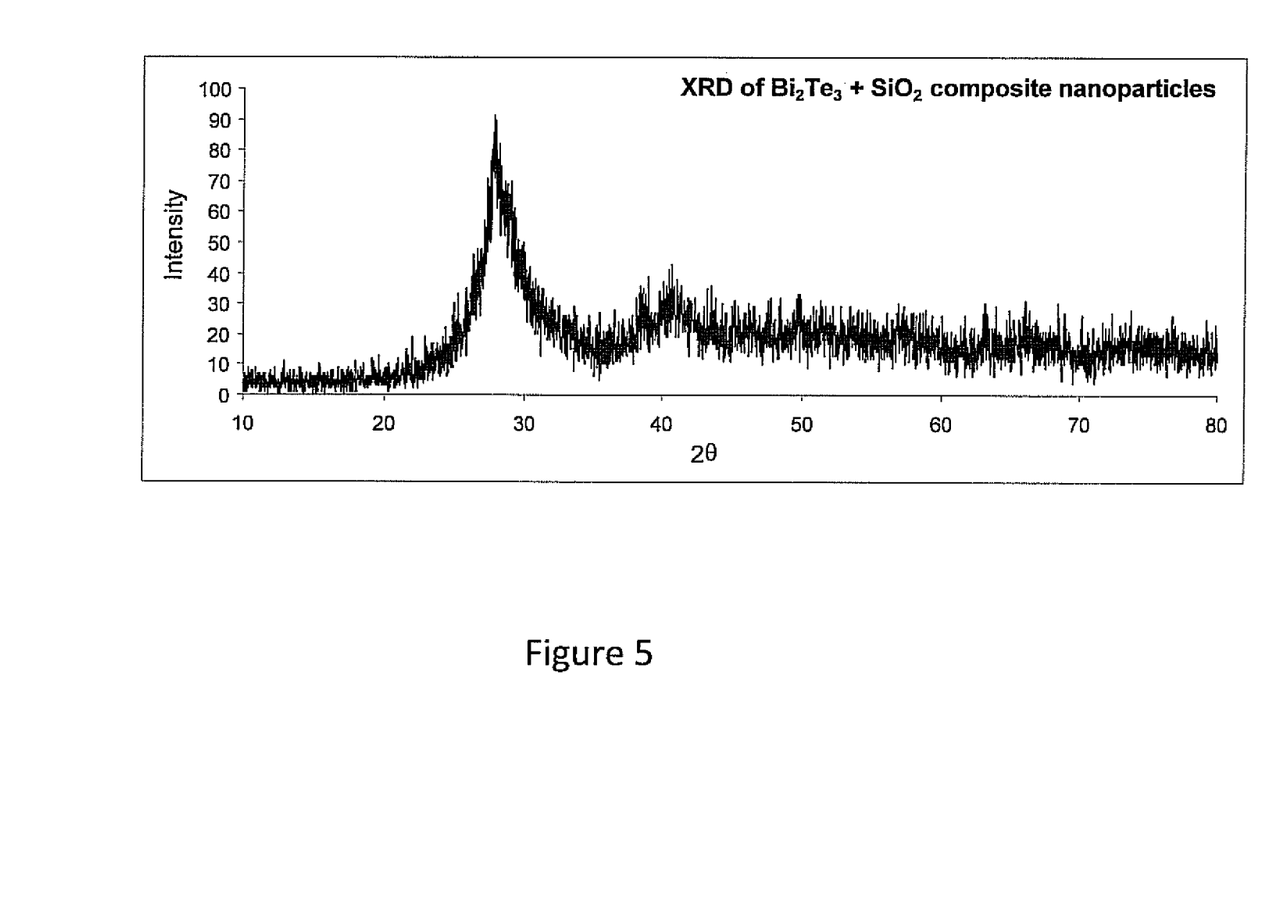
FIG. 5 is an XRD plot of the material of FIG. 4.
Figure 6:
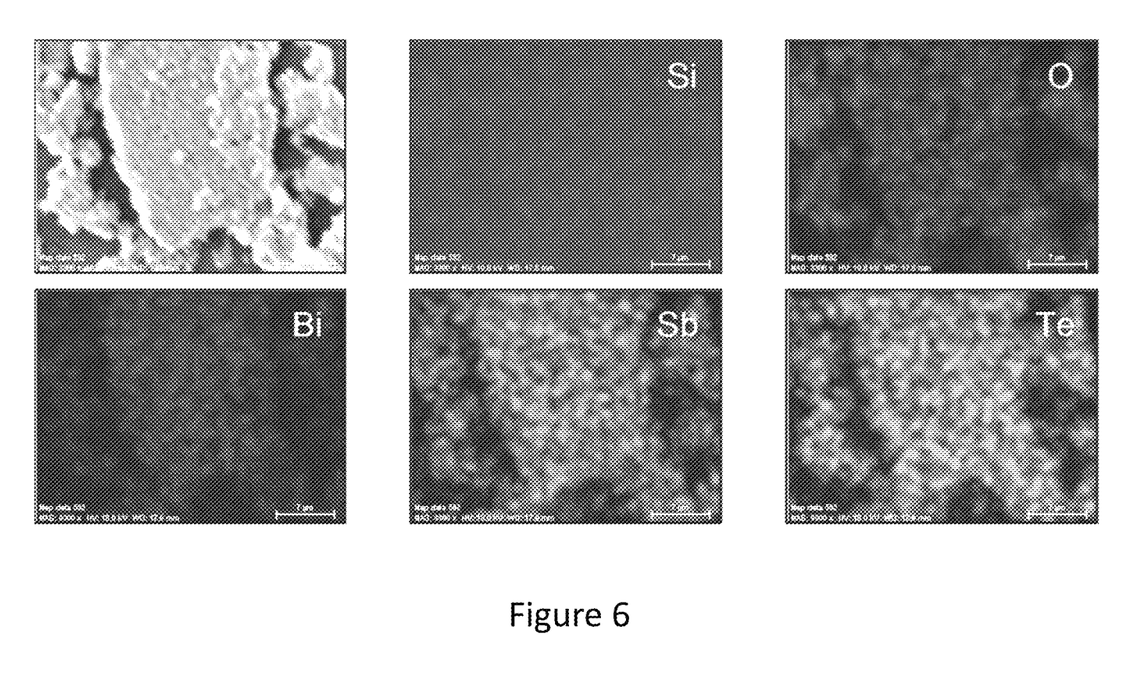
FIG. 6 is an SEM image of a material formed by the reaction of FIG. 2.
Figure 7:
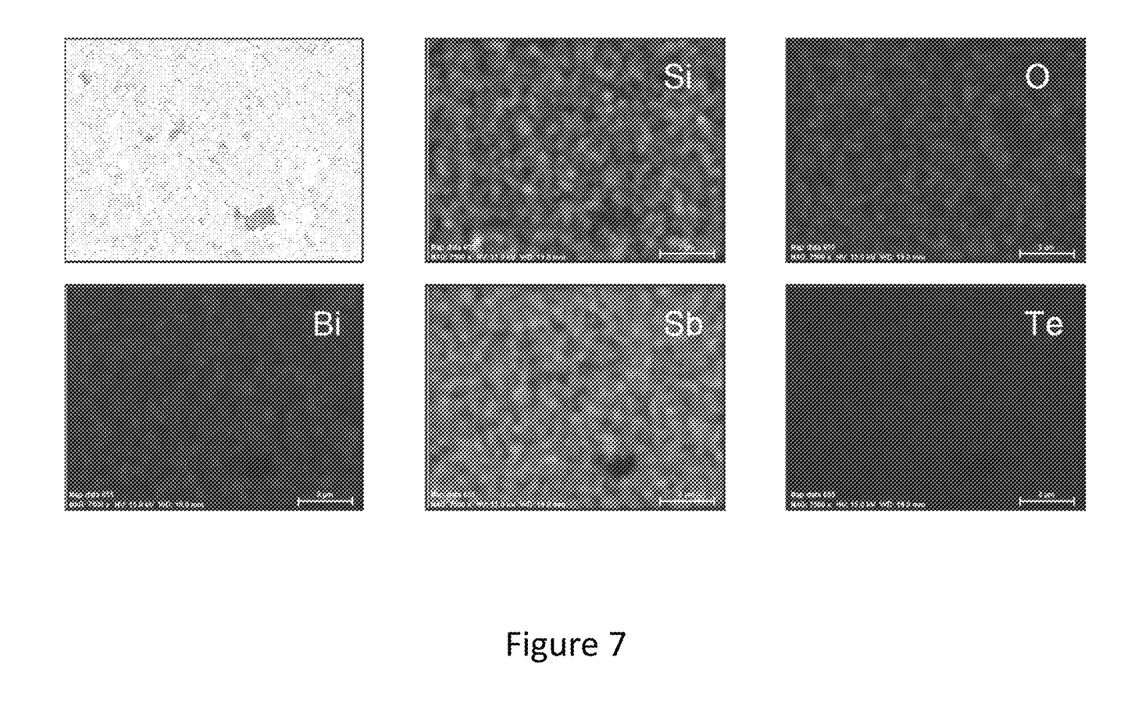
FIG. 7 is an SEM image of the material of FIG. 6 after being sintered.
Figure 8:
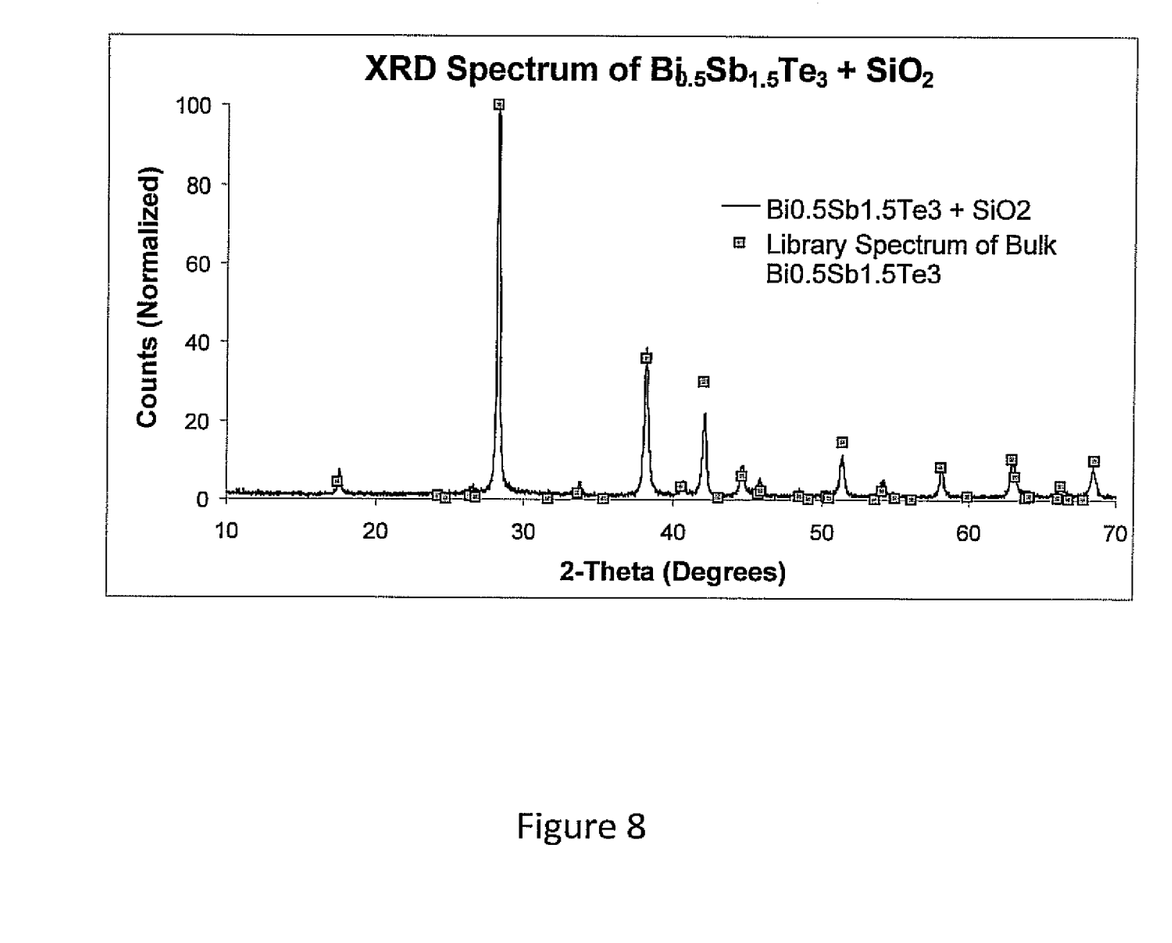
FIG. 8 is an XRD spectrum of a bismuth telluride material including antimony.
Figure 10:
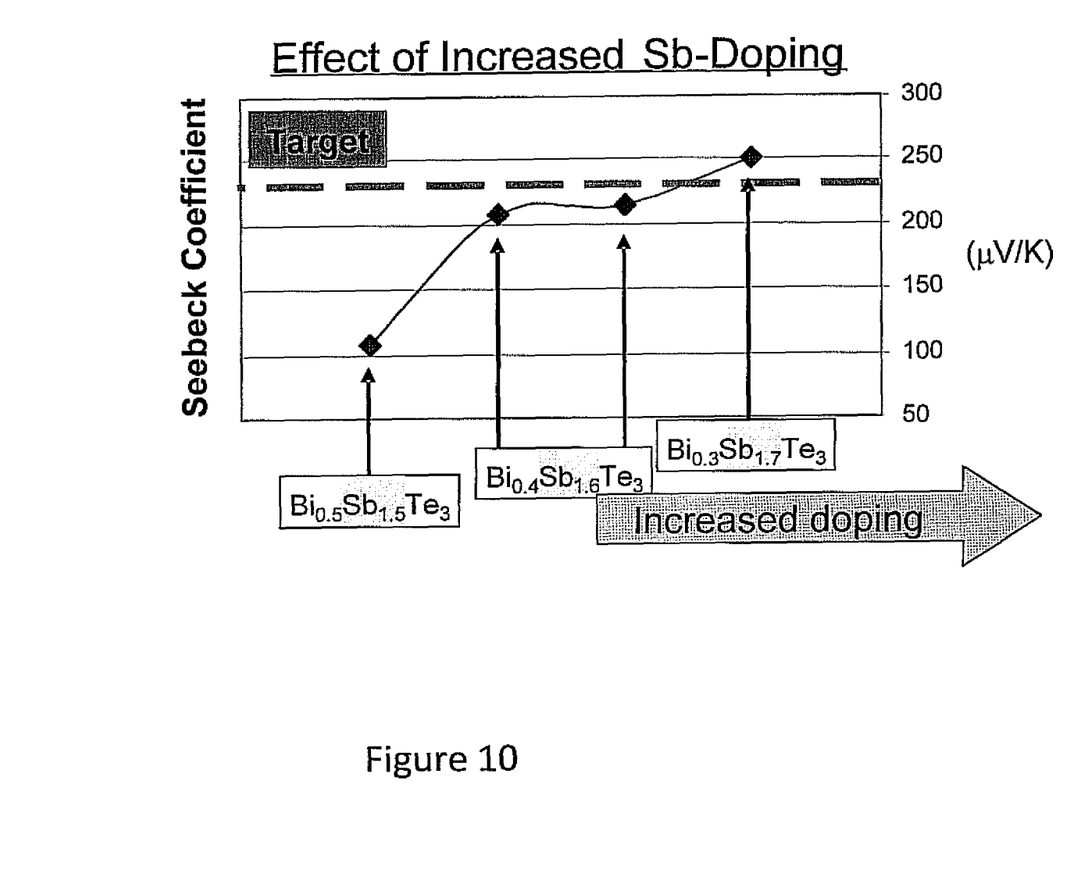
FIG. 10 is a plot showing the effect on the Seebeck Coefficient of increased Antimony doping.

In addition to the bismuth telluride material of FIGS. 4 and 5 doped bismuth telluride materials may also be produced. As shown in FIGS. 6-8 a P-type antimony doped material may be produced by the above described procedure. The SEM images of the antimony doped material are shown in FIGS. 6 and 7 both for the material before and after sintering. The SEM images indicate a homogeneous distribution of Sb, Bi, Te, O, and Si species. The XRD data for the antimony doped sample is shown in FIG. 8. The XRD data indicates a pure sample of an antimony doped bismuth telluride in comparison to a known XRD spectrum for the material. The antimony doped bismuth telluride has a Seebeck coefficient measurement of 244 µV/K. FIG. 10 is a figure showing how various levels of antimony doping may vary the Seebeck coefficient. Various materials may be produced to achieve a desired Seebeck coefficient.

Figure 9:
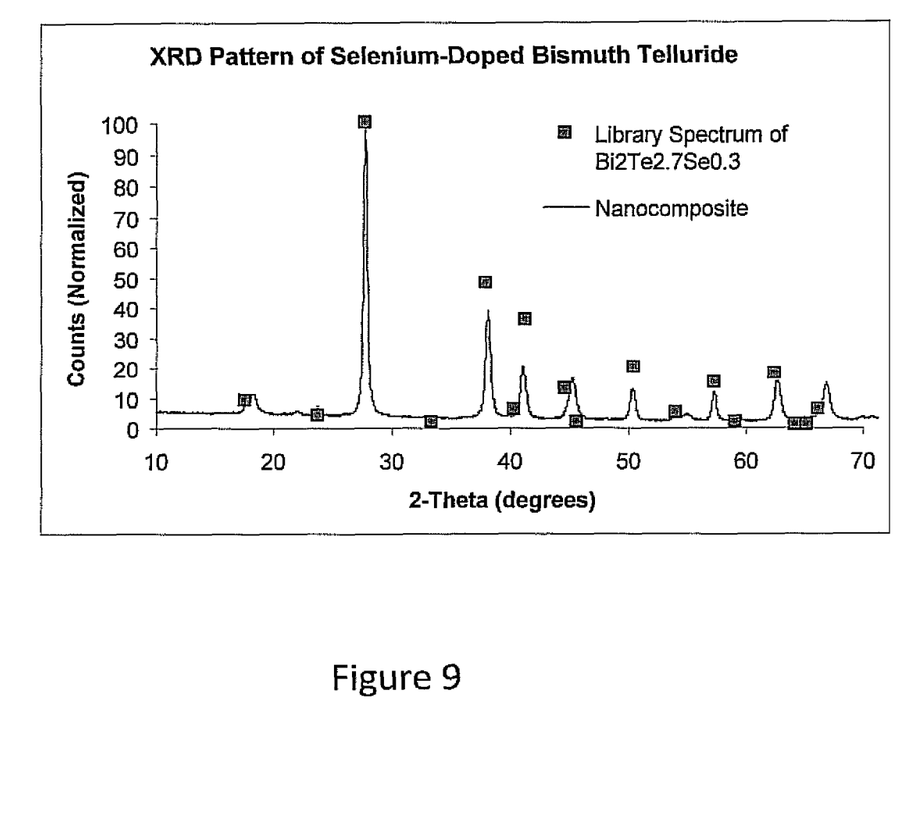
FIG. 9 is an XRD spectrum of a bismuth telluride material including Selenium.

Additionally, an N-type doped thermoelectric material may be produced by the procedure outlined in the specification and examples. Selenium may be used as a doping material to produce N-type bismuth telluride material. An XRD spectra of the selenium doped material is shown in FIG. 9.

The invention claimed is:

1. A process for forming thermoelectric nanoparticles including the steps of:
   providing a core material and a bismuth containing compound dispersed in a basic solution;
   providing a tellurium containing compound;
   reacting the bismuth containing compound dispersed in the basic solution with the tellurium containing compound forming thermoelectric nanoparticles;
   wherein the bismuth containing compound is selected from: bismuth citrate and ammonium bismuth citrate.

2. The process of claim 1 wherein the tellurium containing compound is selected from tellurium, tellurium salts and sodium tellurium hydride.

3. The process of claim 1 including the step of providing a P-type dopant with the bismuth containing compound.

4. The process of claim 3 wherein the P-type dopant is selected from: antimony, antimony salt, and potassium antimony tartrate.

5. The process of claim 1 including the step of providing an N-type dopant with the tellurium containing compound.

6. The process of claim 1 wherein the N-type dopant is selected from: selenium, sodium selenium hydride, and selenium salt.

7. A process for forming thermoelectric nanoparticles including the steps of:
   providing a core material and a bismuth containing compound dispersed in a basic solution;
   providing a tellurium containing compound;
   reacting the bismuth containing compound dispersed in the basic solution with the tellurium containing compound forming thermoelectric nanoparticles forming a core material reverse micelle or micelle;
   adding the bismuth containing compound to the core material reverse micelle or micelle forming a reverse micelle or micelle having the bismuth containing compound dispersed therein;
   adding the tellurium containing compound with the formed micelle or reverse micelle in the presence of a reducing agent that alloys with the bismuth containing compound forming composite thermoelectric nanoparticles having a core and shell structure.

8. The process of claim 7 wherein the step of adding the bismuth containing compound includes providing a P-type dopant with the bismuth containing compound.

9. The process of claim 7 wherein the step of adding the tellurium containing compound includes providing an N-type dopant with the tellurium containing compound.

10. The process of claim 7 wherein the step of adding the tellurium containing compound includes forming a reverse micelle or micelle having the tellurium containing compound dispersed therein.

11. The process of claim 10 including providing an N-type dopant with the tellurium containing compound.

12. The process of claim 7 wherein the step of forming a core material micelle or reverse micelle includes the steps of:
   dissolving a surfactant in an organic solvent or aqueous solution;
   adding an aqueous phase or organic phase to the dissolved surfactant; and a step selected from the group consisting of:
   adjusting the pH to initiate a core formation reaction;
   introducing a reagent to initiate a core formation reaction;
   irradiating or heating to initiate a core formation reaction;
   adjusting the pH to stabilize the system.

13. The process of claim 7 wherein the step of forming a micelle or reverse micelle having a bismuth containing compound dispersed therein includes the steps of:
   dissolving a surfactant in a solvent or aqueous solution;
   adding the bismuth containing material to the dissolved surfactant forming a reverse micelle or micelle having a solvent or an aqueous portion including the bismuth containing material.

14. The process of claim 13 wherein the step of forming a micelle or reverse micelle having the bismuth containing compound dispersed therein includes the steps of:
   dissolving a surfactant in a solvent or aqueous solution;
   adding dopant to the dissolved surfactant forming a micelle or reverse micelle having an aqueous portion including the dopant.

15. The process of claim 7 wherein the step of forming a core material micelle or reverse micelle includes the steps of:
   dissolving a surfactant in a solvent;
   adding ammonium hydroxide to the dissolved surfactant;
   adding tetramethylorthosilicate to from $SiO_2$ nanoparticles dispersed in an aqueous portion of the micelle or reverse micelle;
   adding a bismuth containing compound.

16. The process of claim 15 wherein the step of forming a bismuth containing compound micelle or reverse micelle includes the steps of:
   dissolving a surfactant in a solvent;
   adding bismuth citrate to the dissolved surfactant forming a micelle or reverse micelle having an aqueous portion including bismuth citrate.

17. The process of claim 10 wherein the step of forming a telluride micelle or reverse micelle includes the steps of:
   dissolving a surfactant in a solvent;
   forming a NaTeH material and adding the NaTeH material to the dissolved surfactant forming a micelle or reverse micelle having an aqueous portion including NaTeH.

18. The process of claim 17 including a step of adding bismuth citrate wherein bismuth ions of the bismuth citrate are reduced to bismuth metal in the presence of tellurium wherein a spontaneous alloying occurs about $SiO_2$ core nanoparticles.

19. The process of claim 1 wherein the tellurium compound is added in a micelle or reverse micelle.

20. The process of claim 1 wherein a solution of the tellurium compound is added without a micelle or reverse micelle.

21. The process of claim 1 wherein the tellurium compound is added as a powder.

22. The process of claim 1 wherein the core material nanoparticles have a size of from 1 to 50 nanometers in diameter.

23. The process of claim 1 wherein the composite thermoelectric nanoparticles have a shell thickness of 0.5 to 100 nanometers.

24. The process of claim 1 including the step of decanting the composite thermoelectric nanoparticles.

25. The process of claim 1 including the step of washing the composite thermoelectric nanoparticles.

26. The process of claim 25 wherein the washing step includes the steps of washing the composite thermoelectric nanoparticles with an organic solvent and aqueous washing multiple times with each washing followed by isolation of nanoparticles.

27. The process of claim 1 wherein the nanoparticles spontaneously fuse forming a nanocomposite material following the formation of the composite thermoelectric nanoparticles wherein the nanocomposite material includes a network.

28. The process of claim 1 when the forming step includes sintering the composite thermoelectric nanoparticles forming a network of the shell material including inclusions of the core material nanoparticles.

29. The process of claim 1 including the steps of:
- forming a core material reverse micelle or micelle;
- adding bismuth citrate to the core material reverse micelle or micelle forming a reverse micelle or micelle having the bismuth citrate dispersed therein;
- adding a tellurium containing compound with the formed micelle or reverse micelle in the presence of a reducing agent that alloys with the bismuth citrate forming composite thermoelectric nanoparticles having a core and shell structure.

30. The process of claim 29 wherein the step of adding bismuth citrate includes adding potassium antimony tartrate to the core material micelle or reverse micelle.

31. The process of claim 29 wherein the step of adding a tellurium containing compound includes adding selenium.

* * * * *